United States Patent
Naksrikram et al.

(10) Patent No.: US 6,966,016 B2
(45) Date of Patent: Nov. 15, 2005

(54) SYSTEM AND METHOD FOR ERASE TEST OF INTEGRATED CIRCUIT DEVICE HAVING NON-HOMOGENEOUSLY SIZED SECTORS

(75) Inventors: Janevoot Naksrikram, Bangkok (TH); Aeksit Suraphak, Sunnyvale, CA (US); Jitrayut Junnapart, Nonthaburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 690 days.

(21) Appl. No.: 09/836,065

(22) Filed: Apr. 16, 2001

(65) Prior Publication Data
US 2002/0152435 A1  Oct. 17, 2002

(51) Int. Cl.$^7$ .............................................. G11C 29/00
(52) U.S. Cl. .................................... 714/718; 365/201
(58) Field of Search ................................ 714/718, 715, 714/733; 365/45, 201, 185.3, 218, 185, 185.33; 711/103, 167; 324/211

(56) References Cited

U.S. PATENT DOCUMENTS

| | | | |
|---|---|---|---|
| 5,343,434 A | * 8/1994 | Noguchi ................. | 365/185.04 |
| 5,553,026 A | * 9/1996 | Nakai et al. ................. | 365/201 |
| 5,581,510 A | 12/1996 | Furusho et al. | |
| 5,615,148 A | 3/1997 | Yamamura et al. | |
| 5,646,948 A | * 7/1997 | Kobayashi et al. ......... | 714/719 |
| 5,675,546 A | * 10/1997 | Leung ........................ | 365/201 |
| 5,812,460 A | 9/1998 | Kobatake | |
| 5,892,776 A | * 4/1999 | Kumakura .................. | 714/718 |

FOREIGN PATENT DOCUMENTS

| | | |
|---|---|---|
| EP | 0 844 619 A2 | 5/1998 |
| EP | 0 844 619 A3 | 6/1999 |

* cited by examiner

*Primary Examiner*—Joseph Torres
*Assistant Examiner*—Mujtaba Chaudry
(74) *Attorney, Agent, or Firm*—Farjami & Farjami LLP

(57) ABSTRACT

A system and method for testing a flash memory device having uniform sectors and smaller, "boot" sectors includes determining uniform and boot test limits. The uniform and boot test limits are determined based on average erase and APDE time periods of the uniform and boot sectors, respectively. In this way, the erase test results for each sector type is compared against test limits that are based only on that sector type, thereby avoiding excessive false rejects.

18 Claims, 2 Drawing Sheets

Erase Test

Overall Test Flow

Erase Test

Test Evaluation

SYSTEM AND METHOD FOR ERASE TEST OF INTEGRATED CIRCUIT DEVICE HAVING NON-HOMOGENEOUSLY SIZED SECTORS

TECHNICAL FIELD

The present invention relates generally to testing integrated circuit devices such as flash memory devices.

BACKGROUND OF THE INVENTION

Semiconductor devices, including integrated circuit devices such as boot-type devices, are tested prior to shipment to ensure quality control. In the case of boot-type devices known as flash memory devices, the testing can include parametric tests, including testing for short circuits, open circuits, various leakage tests, and various signature tests. Also, the testing can include various performance or functional tests, such as speed tests and erase time tests. Of importance to the present invention is testing a device for erase time.

Specifically, to determine whether a device can be erased adequately, each sector in the device is programmed, and then the device is erased, sector by sector, with the time period required for erasure being recorded for each sector. In the event that any leakage is detected after an erase operation, a test known as Auto Program Disturb Erase (APDE) is performed to cure the leakage, and then the APDE time period is also recorded. A test limit is then calculated that is essentially the average (or, e.g., 1.5 times the average) of the erase time periods and APDE time periods of all the sectors. If the time periods required for any sector exceed the test limit, the device is rejected.

As recognized by the present invention, for test purposes it has been assumed that flash memory devices have equally-sized sectors, that is, all the sectors to be tested of flash memory devices are assumed to be of uniform size. Accordingly, a single test limit has been used against which the erase/APDE times of all sectors are compared.

The present invention understands, however, that flash memory devices can have some sectors of one uniform size (typically of a larger size) and other sectors (boot sectors) of other, non-uniform sizes (typically of smaller sizes and, hence, colloquially referred to as "baby sectors"). In these devices, the smaller baby sectors should have shorter erase times than the larger uniform sectors. Nonetheless, current test procedures still use a single test limit against which all sectors are compared. The present invention recognizes that when a single test limit is used, it is based on times derived from both the uniform sectors and baby sectors and, hence, might be set too low for uniform sectors, thus resulting in a large number of false rejects. Having made the above critical observations, the present invention provides the below-solutions to one or more of the observations.

BRIEF SUMMARY OF THE INVENTION

A method for testing a semiconductor device having at least one first sector of a first sector type (e.g., a uniform sector) and at least one second sector of a second sector type (e.g., a boot sector) includes measuring at least one first time period, such as erase time and/or APDE time, that is related to erasing the first sector. The method also includes establishing a first test limit based at least in part on the first time period. Further, the method includes measuring at least one second time period related to erasing the second sector, and establishing a second test limit based at least in part on the second time period. The first and second test limits are used to determine whether the device passes or fails an erase test.

In a preferred embodiment, the device includes many first sectors and many second sectors, and the first test limit is based at least in part on an average of first time periods associated with respective first sectors. Likewise, the second test limit is based at least in part on an average of second time periods associated with respective second sectors.

As indicated above, more than one time period can be used, and preferably both erase time and APDE time are used. Accordingly, the preferred method can include measuring at least one third time period related to erasing the first sector and measuring at least one fourth time period related to erasing the second sector. The first and second time periods can be erase time periods and the third and fourth time periods can be APDE time periods. Consequently, the first test limit preferably is based on the first and third time periods (uniform sector average erase time and uniform sector average APDE time), while the second test limit is based on the second and fourth time periods (boot sector average erase time and boot sector average APDE time).

For each sector, the preferred method can also determine whether the time period associated with the sector exceeds the test limit associated with the time period of the sector. If it does, the device is rejected. At least one parameter test can also be executed on the device.

Other features of the present invention are disclosed or apparent in the section entitled "DETAILED DESCRIPTION OF THE INVENTION".

DETAILED DESCRIPTION OF THE INVENTION

Figure 1:
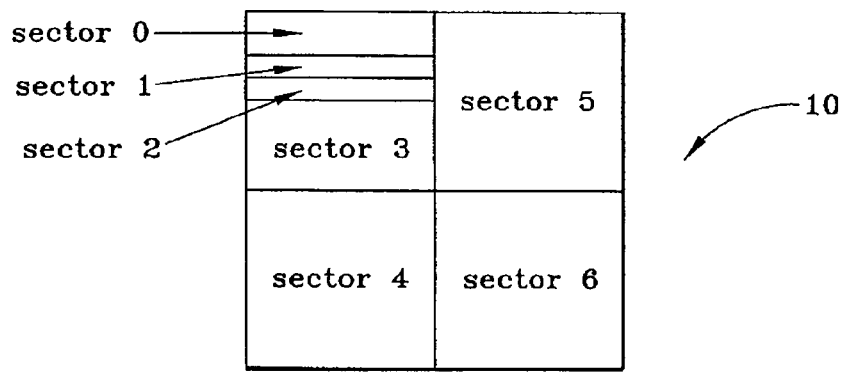
FIG. 1 is a schematic view of a flash memory device having uniform sectors and non-uniform sectors.

Referring initially to FIG. 1, a semiconductor device, more specifically a bootable device, and still more specifically a flash memory device, is shown and generally designated 10. As shown, the device includes plural sectors. The sectors labeled "sector 5", "sector 6", and "sector 4" are all uniformly sized, relatively large sectors. This means they all have the same number of memory cells. On the other hand, the sectors labeled "sector 0", "sector 1", "sector 2", and "sector 3" are non-uniformly sized, compared to the uniformly sized sectors, are relatively small and, hence, can be referred to as "baby sectors". These sectors are also known as "boot sectors". The sectors 0–3 can be the same size as each other or, as shown, the sectors 1 and 2 can have the same size, sector 0 can be larger than sector 1, and sector 3 can be larger than sector 0. In any case, the boot sectors are generally smaller than the uniform sectors.

Figure 2:
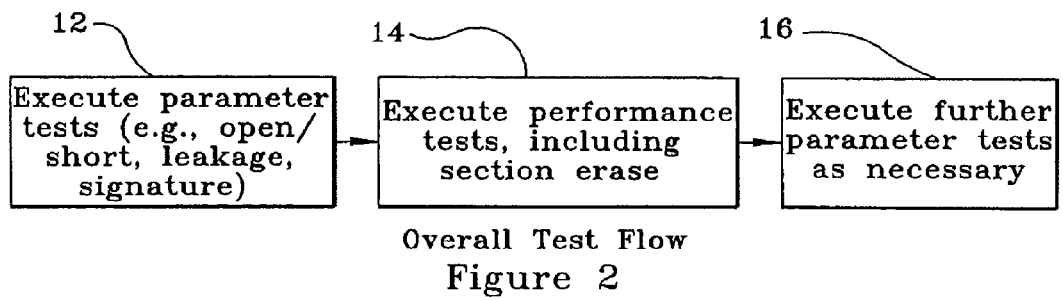
FIG. 2 is a flow chart of the overall logic of the present invention.

FIG. 2 shows the overall logic by which the present invention operates. Commencing at block 12, certain parameter tests can be executed on the device 10. These tests include, but are not limited to, tests for open circuits and short circuits, certain electrical leakage tests including in-leakage, and certain device signature tests. Moving to block 14, performance (functional) tests are conducted, including but not limited to the section erase test described further below. Then, at block 16 additional parameter tests can be executed if desired/necessary.

Figure 3:
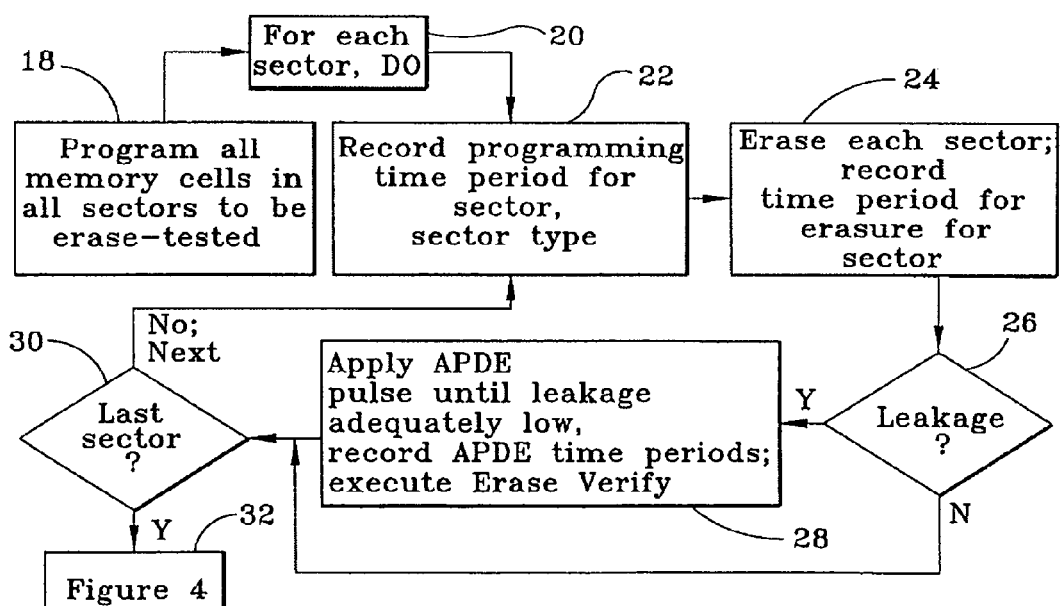
FIG. 3 is a flow chart of the erase test logic.

The erase test logic is shown in FIG. 3. Commencing at block 18, all cells in all sectors are programmed, so that the cells can be subsequently erased. Moving to block 20, a DO loop is entered for each sector. At block 22 the programming time period for each sector is recorded, as is the sector type/size. Programming time period can, of course, be recorded during the process at block 18, and sector size/type can likewise be recorded. Moving to block 24, the sector is erased and its erase time period recorded.

Next, at decision diamond 26 it is determined whether the sector experienced any electrical leakage during erasure, and if so, an Auto Program Disturb Erase (APDE) pulse is generated at block 28 to cure the leakage, i.e., APDE is applied until the leakage is below a threshold. The time period to conduct the APDE test is recorded, and a routine known as "erase verify" is conducted in accordance with flash memory test principles known in the art to verify that the sector under test is erased.

From block 28 or decision diamond 26 when the test there is negative, the logic moves to decision diamond 30 to determine whether the last sector has been tested. If not, the next sector is tested starting at block 22. At the end of the process of FIG. 3, the test is evaluated at state 32 using the logic of FIG. 4.

Figure 4:
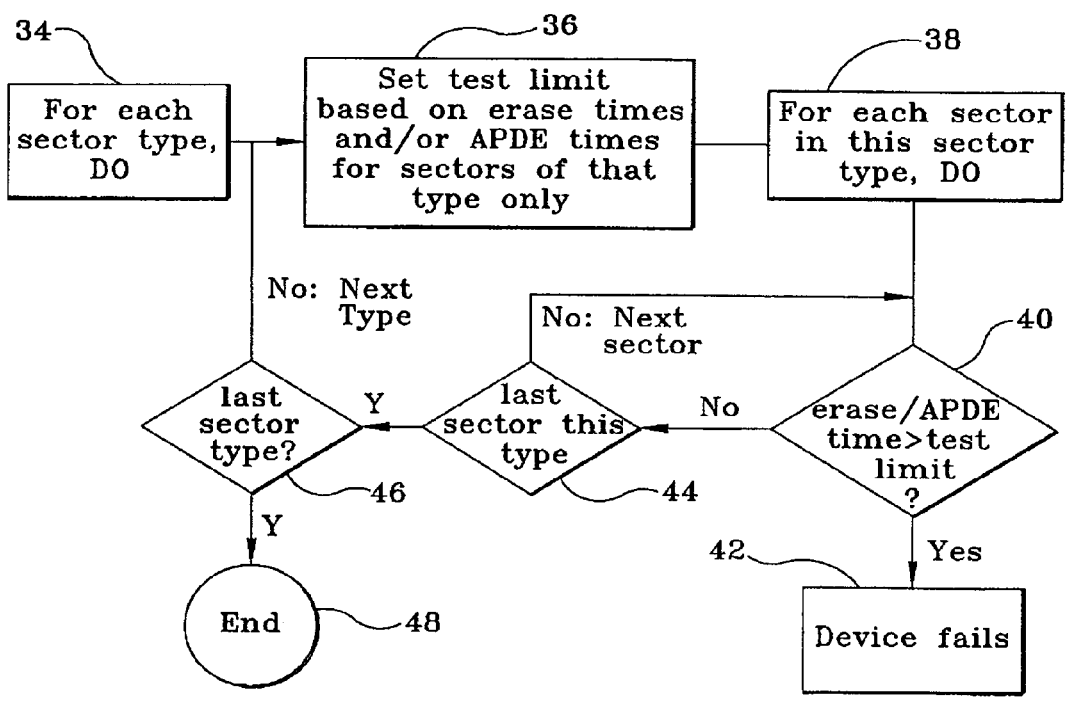
FIG. 4 is a flow chart of the erase test evaluation logic.

FIG. 4 shows the erase test evaluation logic. Commencing at block 34, a DO loop is entered for each sector type/size. For instance, each sector type might be defined by sectors having exactly the same size as other sectors in that type. Or, two sector types—uniformly sized memory sectors, and boot sectors regardless of size, might be defined.

In any case, at block 36 a test limit for the type under test is defined. The test limit is based on one or more, preferably both of: the average erase time period for sectors in the type, and the average APDE time period for sectors in the type. In a particularly preferred embodiment, the test limit is defined to be 1.5 times the sum of the average erase time period plus the average APDE time period.

After defining the test limit for the sector type under test, the logic moves to block 38 to enter a DO loop for each sector in the type. Proceeding to decision diamond 40 it is determined whether either one or the sum of both of the sector's erase time period plus APDE time period exceed the test limit. Preferably, the sum of the segment's erase time period and APDE time period are compared to the test limit at decision diamond 40. If the sum exceeds the limit, "FAIL" is returned at block 42 and the device 10 is rejected. Otherwise, the logic moves to decision diamond 44 to determine whether the last sector in the type has been tested, and if not, the next sector is tested starting at decision diamond 40. If the last segment in the type has been tested the logic moves from decision diamond 44 to decision diamond 46 to determine whether the last sector type has been evaluated, and if not the next sector type is tested starting at block 36. Otherwise, the logic ends at state 48.

The above logic can be embodied in a computer or other digital processor that is programmed to execute method acts in accordance with the logic, and it can be stored on a computer-readable medium such as a hard disk drive, diskette, optical disk, ROM or RAM, and so on.

While the particular SYSTEM AND METHOD FOR ERASE TEST OF INTEGRATED CIRCUIT DEVICE HAVING NON-HOMOGENEOUSLY SIZED SECTORS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. A method for testing a semiconductor device having a first sector of a first sector type memory size and a second sector of a second sector type memory size, the method comprising:
    measuring a first time period related to erasing the first sector;
    establishing a first test limit based on the first time period;
    measuring a second time period related to erasing the second sector;
    establishing a second test limit based on the second time period; and
    determining whether the device passes or fails an erase test by using the first test limit and the second test limit during the erase test.

2. The method of claim 1, wherein the semiconductor device comprises a plurality of first sectors and a plurality of second sectors, and the first test limit is based on an average of first time periods associated with the first time period for each of the first sectors and the second test limit is based on an average of second time periods associated with the second time period for each of the second sectors.

3. The method of claim 1 further comprising:
    measuring a third time period related to erasing the first sector; and
    measuring a fourth time period related to erasing the second sector, the first and second time periods being erase time periods; and the third and fourth time periods being auto program disturb erase time periods, the first test limit being based on at least one of the first and third time periods; the second test limit being based on at least one of the second and fourth time periods.

4. The method of claim 3, wherein the first test limit is based on both of the first and third time periods, and the second test limit is based on both of the second and fourth time periods.

5. The method of claim 2 further comprising:
    measuring a third time periods related to erasing each of the plurality of first sectors; and
    measuring a fourth time periods related to erasing each of the plurality of second sectors, the first and second time periods being erase time periods; and the third and fourth time periods being auto program distrub erase time periods, the first test limit being based on at least one of the first and third time periods; the second test limit being based on at least one of the second and fourth time periods.

6. The method of claim 5, wherein the first test limit is based on both of the first and third time periods, and the second test limit is based on both of the second and fourth time periods.

7. The method of claim 1, wherein the act of determining includes determining whether a time period associated with erasing the first sector exceeds the first test limit and whether a time period associated with erasing the second sector exceeds the second test limit.

8. The method of claim 1, further comprising executing at least one parameter test on the device, wherein said at least one parameter test is selected from the group consisting of a test for open circuits, a test for short circuits, test for electrical leakage, and a device signature test.

9. The method of claim 1, wherein the second sector is a boot sector.

10. A system for testing a semiconductor device having a first sector of a first sector type memory size and a second sector of a second sector type memory size, the system comprising:
- a measuring element configured to measure a first time period related to erasing the first sector, the measuring element further configured to measure a second time period related to erasing the second sector;
- an establishing element configured to establish a first test limit based on the first time period, the establishing element further configured to establish a second test limit based on the second time period; and
- a determining element configured to determine whether the device passes or fails an erase test by using the first test limit and the second test limit during the erase test.

11. The system of claim 10, wherein the device comprises a plurality of first sectors and a plurality of second sectors, and the first test limit is based on an average of first time periods associated with the first time period for each of the first sectors and the second test limit is based on an average of second time periods associated with the second time period for each of the second sectors.

12. The system of claim 10, wherein the measuring element is further configured to measure a third time period related to erasing the first sector and a fourth time period related to erasing the second sector, and wherein the first and second time periods being erase time periods and the third and fourth time periods being auto program disturb erase time periods; the first test limit being based on at least one of the first and third time periods; the second test limit being based on at least one of the second and fourth time periods.

13. The system of claim 12, wherein the first test limit is based on both of the first and third time periods, and the second test limit is based on both of the second and fourth time periods.

14. The system of claim 11, wherein the measuring element is further configured to measure a third time period related to erasing each of the plurality of first sectors and a fourth time period related to erasing each of the plurality of second sectors, the first and second time periods being erase time periods and the third and fourth time periods being auto program disturb erase time periods; the first test limit being based on at least one of the first and third time periods; the second test limit being based on at least one of the second and fourth time periods.

15. The system of claim 14, wherein the first test limit is based on both of the first and third time periods, and the second test limit is based on both of the second and fourth time periods.

16. The system of claim 10, wherein the determining element determines whether a time period associated with erasing the first sector exceeds the first test limit and whether a time period associated with erasing the second sector exceeds the second test limit.

17. The system of claim 10, wherein the system executes at least one parameter test on the device, wherein said at least one parameter test is selected from the group consisting of a test for open circuits, a test for short circuits, a test for electrical leakage, and a device signature test.

18. The system of claim 10, wherein the second sector is a boot sector.

* * * * *